(12) United States Patent
Crook et al.

(10) Patent No.: US 7,505,317 B2
(45) Date of Patent: Mar. 17, 2009

(54) METHOD, APPARATUS, AND SYSTEM FOR PROVIDING INITIAL STATE RANDOM ACCESS MEMORY

(75) Inventors: Neal A. Crook, Berkshire (GB); David J. Warner, Surrey (GB)

(73) Assignee: Micron Technology Inc., Boise, ID (US)

( * ) Notice: Subject to any disclaimer, the term of this patent is extended or adjusted under 35 U.S.C. 154(b) by 253 days.

(21) Appl. No.: 11/449,755

(22) Filed: Jun. 9, 2006

(65) Prior Publication Data
US 2007/0263443 A1 Nov. 15, 2007

(30) Foreign Application Priority Data
May 9, 2006 (GB) .................................. 0609174.8

(51) Int. Cl.
*G11C 11/34* (2006.01)
*G11C 14/00* (2006.01)
(52) U.S. Cl. ............................. 365/185.08; 365/185.07; 365/185.05; 365/154
(58) Field of Classification Search ............ 365/185.08, 365/185.07, 185.05, 154
See application file for complete search history.

(56) References Cited

U.S. PATENT DOCUMENTS

| | | | |
|---|---|---|---|
| 4,954,988 A | 9/1990 | Robb | |
| 5,311,464 A | 5/1994 | Takase et al. | |
| 5,325,325 A | 6/1994 | Azuma | |
| 5,377,142 A | 12/1994 | Matsumura et al. | |
| 5,870,601 A | 2/1999 | Getzlaff et al. | |
| 6,469,930 B1* | 10/2002 | Murray | 365/185.08 |
| 6,740,925 B2 | 5/2004 | Yoo et al. | |
| 6,867,999 B2 | 3/2005 | Yoo et al. | |
| 7,020,007 B2* | 3/2006 | Kwon | 365/154 |
| 2004/0008539 A1* | 1/2004 | Pascucci | 365/185.07 |
| 2005/0149896 A1 | 7/2005 | Madurawe | |

FOREIGN PATENT DOCUMENTS

| | | |
|---|---|---|
| EP | 0250060 A1 | 12/1987 |
| JP | 61230698 | 10/1986 |
| JP | 63144489 A | 6/1988 |
| JP | 01294296 A | 11/1989 |

* cited by examiner

*Primary Examiner*—Pho M. Luu
*Assistant Examiner*—Toan Le
(74) *Attorney, Agent, or Firm*—Dickstein Shapiro LLP

(57) ABSTRACT

A memory device comprising memory cells having volatile and non-volatile memory portions. The volatile memory portion of each cell includes circuitry for performing RAM functions while the non-volatile memory portion comprises circuitry defining pre-coded data. The memory device comprises a mechanism to operate an initialization sequence, which sets the initial state of the volatile memory portion of each memory cell to the pre-coded data defined in the associated non-volatile memory portion. The initialization sequence allows the initial state of each memory cell's volatile portion to be re-established after power has been applied to the memory device.

16 Claims, 8 Drawing Sheets

METHOD, APPARATUS, AND SYSTEM FOR PROVIDING INITIAL STATE RANDOM ACCESS MEMORY

FIELD OF THE INVENTION

The present invention relates to memory devices and, in particular, to a random access memory device having an initial state.

BACKGROUND OF THE INVENTION

An integrated circuit (IC) includes a large number of tiny transistors on a small chip. An integrated circuit may contain a memory device, where information is stored in the form of binary data. Memory devices can be fabricated such that the data is volatile or nonvolatile. A nonvolatile memory device, e.g., read only memory (ROM), retains its stored information even if it loses power. ROM devices are designed to output pre-coded information. The pre-coded information is specifically designed into the memory device array section during manufacturing; this defines the state of each ROM. Once the manufacturing process is complete, the pre-coded information becomes a permanent part of the memory device.

In contrast, a volatile memory device, e.g., random access memory (RAM), loses its stored information when it loses power. Unlike ROM devices, the state of each RAM device is initially unknown when the manufacturing process has been completed; and once initialized, the state is only retained while the device is powered.

FIG. 1 illustrates an example of a RAM device, i.e. a static RAM device, which loses its initial state when it loses power. The SRAM device 50 comprises an array 58 comprising a plurality of SRAM cells 10 (FIG. 2). As shown in FIG. 2, a data bit is stored in the SRAM cell 10 on four transistors 12, 14, 16, and 18 that form a latch comprising two cross-coupled inverters. Two control transistors 20 and 24 control access to SRAM cell 10 during read and write operations. Data is stored with either a high potential at a bit data node A and a low potential at a bit data node B, or a low potential at the bit data node A and a high potential at the bit data node B. Hence, two stable states are available which are arbitrarily defined as a logic '1' or a logic '0'.

The logic state of SRAM cell 10, i.e., either a '1' or '0', is read by sensing the cell current on bit line pair comprised of bit line output 26 and bit line input 28 and/or the differential voltage developed there between. When word line input 30 and word line output 21 are selected, SRAM cell 10 is activated by turning on control transistors 20 and 24. If the activated SRAM cell 10 is in logic state '1', node A is high and node B is low. Transistor 14 will be off, transistor 18 will be on, transistor 12 will be on, and transistor 16 will be off. Since transistors 18 and 24 are on, bit line input 28 will carry cell current, while bit line output 26 will not carry any cell current. A stored logic state '0' would include having node A low and node B high. Transistor 14 will be on, transistor 18 will be off, transistor 12 will be off, and transistor 16 will be on. Bit line output 26 will carry cell current, while bit line input 28 will not carry cell current.

Referring to FIG. 1, $2^N \times 2^M$ bits are arranged in the array 58 with $2^M$ columns and $2^N$ rows. To read data stored in the array 58, a row address is input and decoded by row decoder 52 to select one word line input 30 and one word line output 21. All of the SRAM cells 10 along word lines 30 and 21 are activated. Column decoder 54 addresses one bit out of the $2^M$ bits that have been activated and routes the data that is stored in that bit to a sense amplifier (not shown) and then out of the array 58. Data in and Data out are controlled by the Read/Write Control circuit 56.

There are variations of RAM devices where the state of the memory device is not lost when it loses power, e.g., nonvolatile RAM (NVRAM) and shadowed memories. An NVRAM's initial state is defined after the manufacturing process has been completed, and typically, the state at power-up is the same as the final state before the previous power-down. Shadowed memories usually contain a RAM portion and an NVRAM portion. As previously mentioned, the initial state of an NVRAM device is set after the manufacturing process, and in shadowed memories, the initial state of the RAM at power-up is obtained by copying the NVRAM stored contents into the RAM. At anytime, it is possible to perform a special sequence to erase the NVRAM and reprogram it to hold the same data as stored in the RAM. In some applications it would be beneficial to have the initial state of volatile memory devices, such as e.g., a static RAM (SRAM), set during manufacturing. It is also beneficial to prevent the stored contents or the current state from being lost when the volatile memory device loses power.

The cost of designing and developing an individual complex integrated circuit can be very costly because an IC comprises millions of interconnected devices. However, ICs are produced as a unit using common photolithography and other fabrication processes, and millions of production units can be mass produced; thereby substantially minimizing individual IC costs. Typically, for a particular fabrication technology, the cost of the IC is proportional to its area; therefore, techniques for reducing an IC's area size are beneficial because they will also reduce costs.

The IC fabrication process involves several steps that require an optically precise image of a stage of the IC being fabricated; the image is generally referred to as the mask. The complete fabrication process may require numerous masks, and a complete set of masks are very expensive.

After the fabrication of a set of masks is complete, any design changes to the IC being fabricated, due to a design error or a desire to produce a part tailored to a specific application, can be very expensive because corresponding changes must be made to the set of masks. The mask for each stage in the fabrication process has a different cost associated with the precision and complexity associated with its manufacture. Therefore, it would be beneficial to make design changes to a restricted number of masks. With respect to ROM devices, it is beneficial to design the memory device such that its contents can be modified by changing a limited number of the lower-cost masks.

BRIEF DESCRIPTION OF THE DRAWINGS

The advantages and features of the present invention will be more apparent from the following detailed description and drawings which illustrate various embodiments of the invention in which.

DETAILED DESCRIPTION OF THE INVENTION

Figure 1:
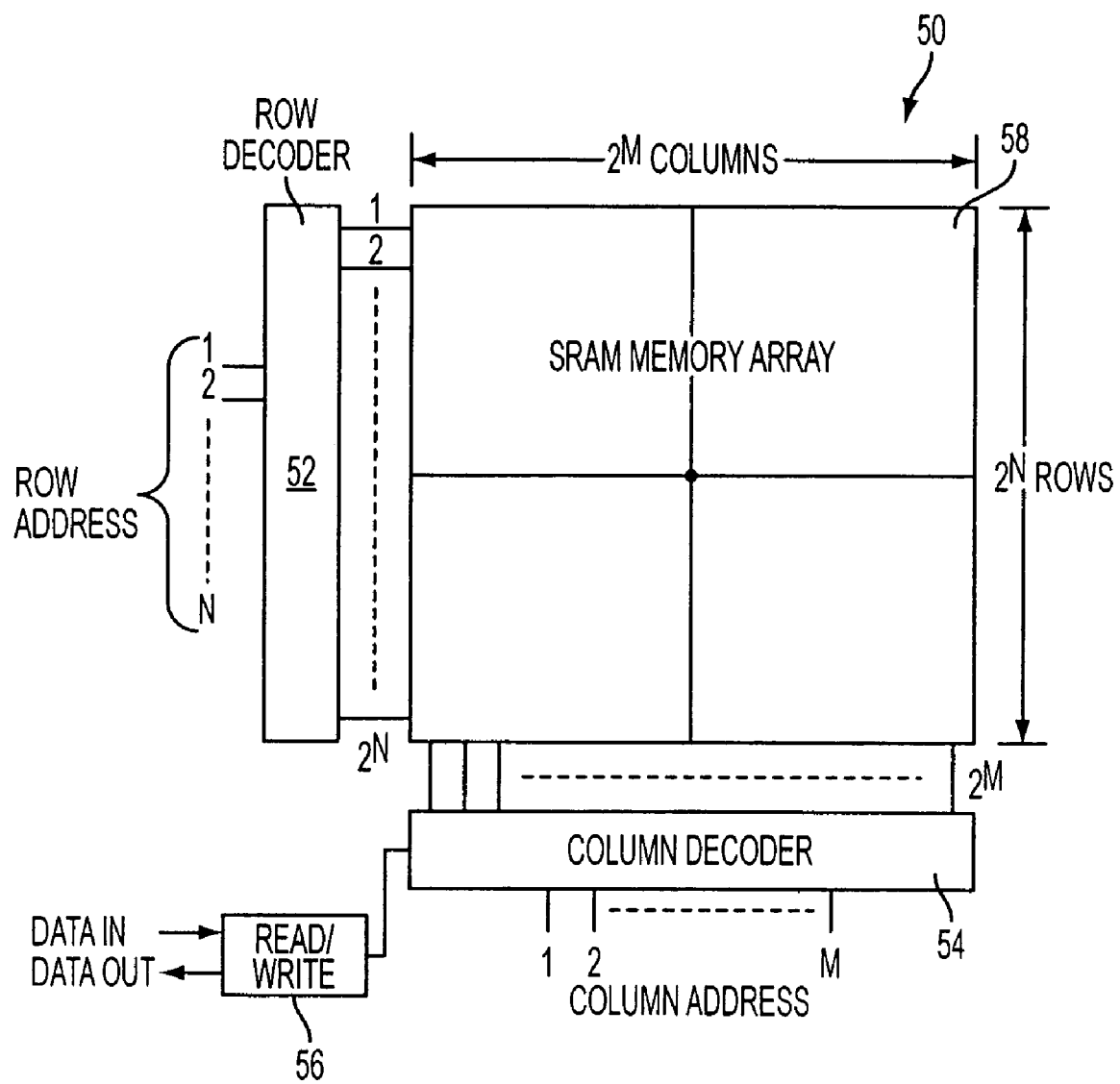
FIG. 1 shows a block diagram illustrating a conventional SRAM memory array.

In the following detailed description, reference is made to the accompanying drawings, which are a part of the specification, and in which is shown by way of illustration various embodiments whereby the invention may be practiced. These embodiments are described in sufficient detail to enable those skilled in the art to make and use the invention. It is to be understood that other embodiments may be utilized, and that structural, logical, and electrical changes, as well as changes in the materials used, may be made without departing from the spirit and scope of the present invention. Additionally, certain processing steps are described and a particular order of processing steps is disclosed; however, the sequence of steps is not limited to that set forth herein and may be changed as is known in the art, with the exception of steps or acts necessarily occurring in a certain order.

According to an exemplary embodiment of the invention, an initial state RAM (ISRAM) cell is provided which comprises a volatile portion and a non-volatile portion. As part of the manufacturing process, the initial state RAM cell's design comprises a volatile portion having associated RAM cell components and a non-volatile portion having associated ROM cell components. More specifically, in an exemplary embodiment, the volatile portion of the initial state RAM memory cell has the circuitry of a static RAM (SRAM) memory cell; however, other volatile memory cells may also be used in the present invention. The non-volatile portion of the initial state RAM cell has circuitry constructed to define pre-coded information, i.e., logic '1' or '0', to act like an associated ROM cell.

As will be explained further, a memory device comprising a plurality of initial state RAM memory cells also includes an embedded initialization sequence. The initialization sequence is a program that sets the initial state of the volatile portion of the initial state RAM cell to be the same as the pre-coded information of the associated ROM portion of the cell. As part of its process, the initialization sequence utilizes the circuitry of the non-volatile portion to determine the pre-coded information, i.e., logic '1' or '0' to be stored in the volatile portion of the memory. The initialization sequence also utilizes the circuitry of the non-volatile portion to control the signals and transistors of the volatile portion that are necessary to set the initial state of the volatile portion based on the pre-coded information. Once the initial state of the volatile portion has been set, it becomes the initial state of the initial state RAM cell. Hereinafter, the setting of the volatile portion to the state of the pre-coded information is referred to as setting the initial state of the initial state RAM. The initialization sequence can be activated at any time to restore the initial state of the initial state RAM cell. As such, the non-volatile portion allows the initial state of the initial state RAM memory cell to be retained even if a memory device employing the cell loses power. Accordingly, the volatile and non-volatile portions of the initial state RAM memory cell allow the memory device to have RAM and ROM functions.

Figure 2:
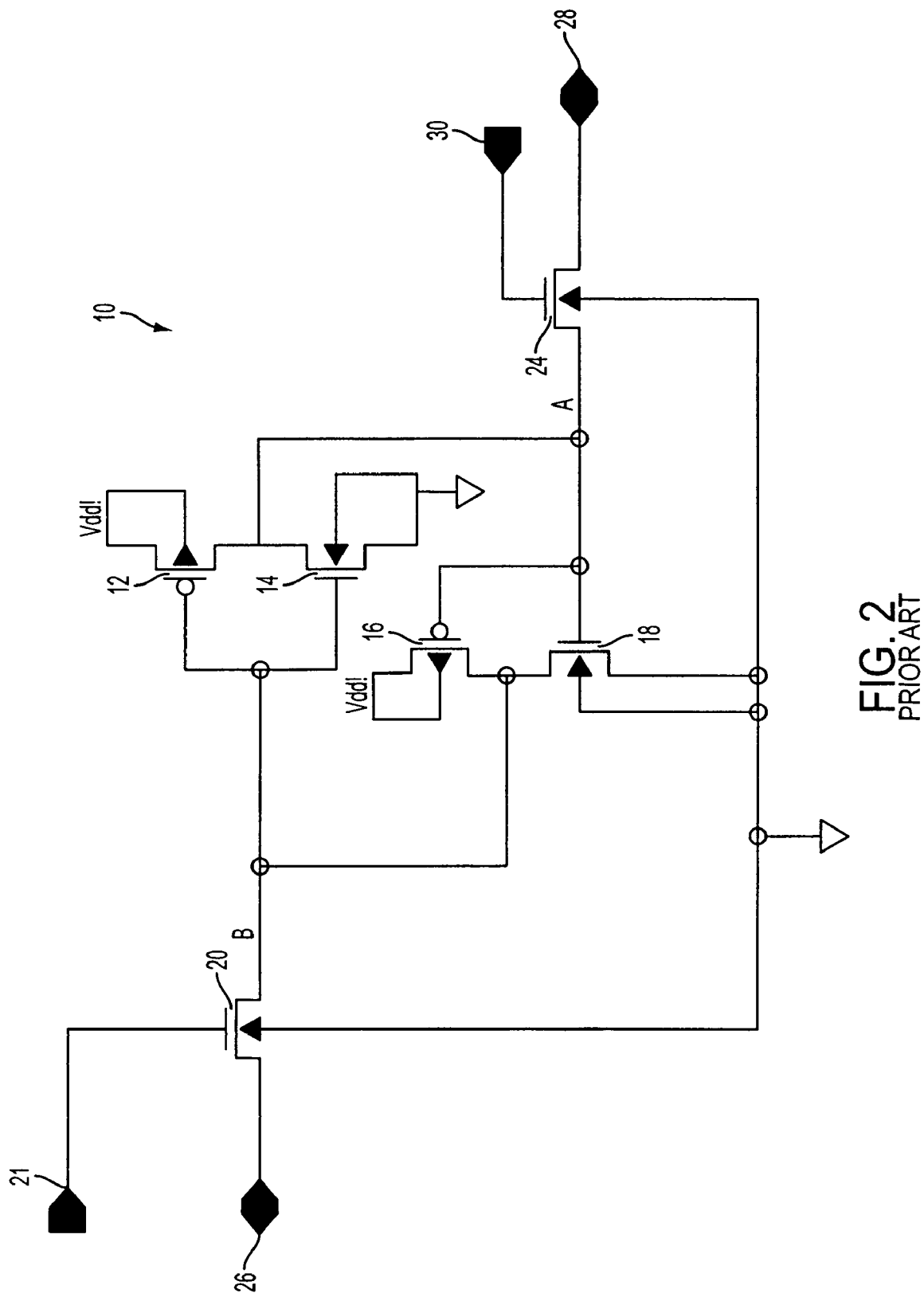
FIG. 2 illustrates a conventional SRAM memory cell.
Figure 3A:
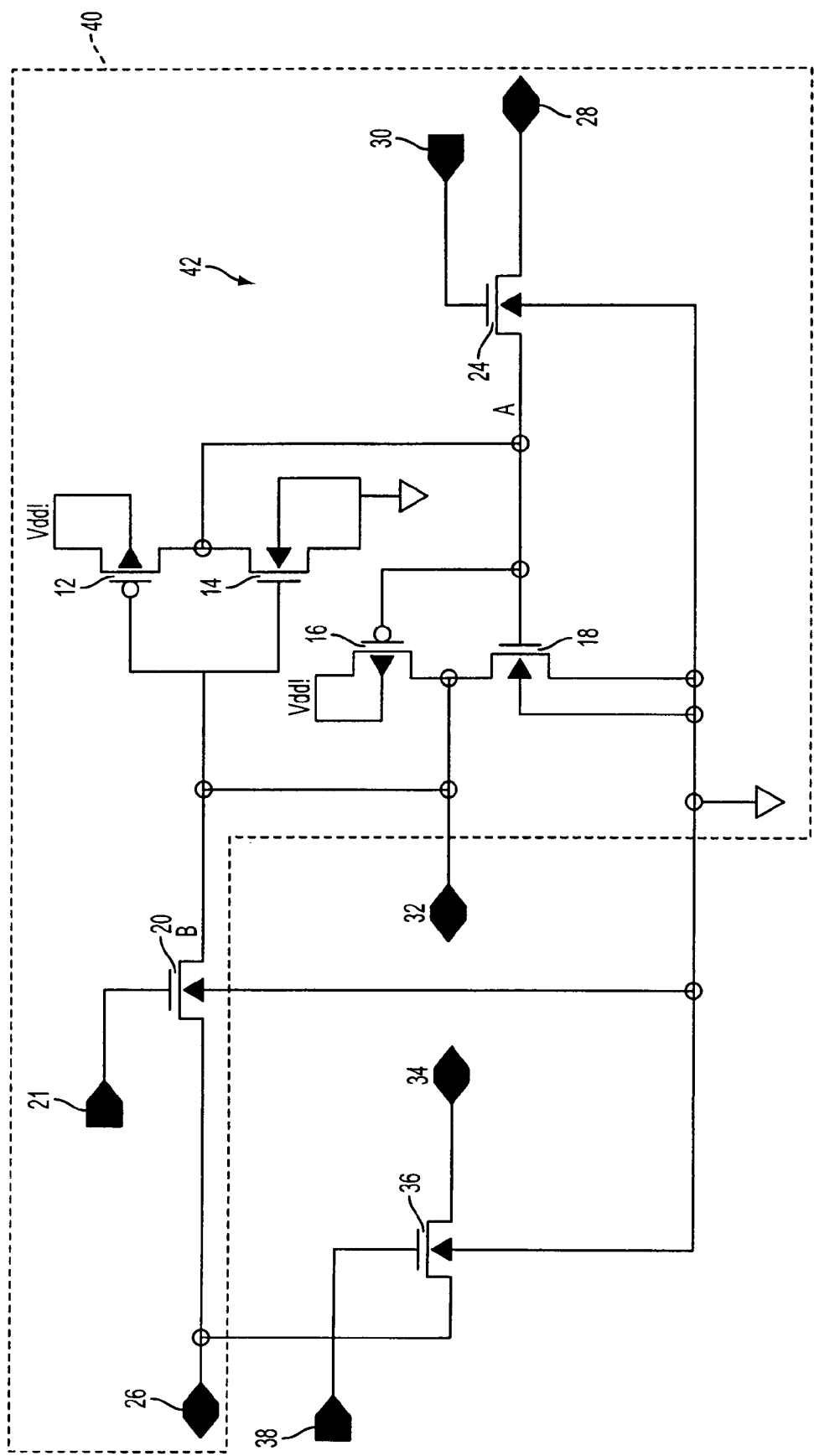
FIGS. 3a and 3b illustrate memory devices according to exemplary embodiments of the invention.
Figure 3B:
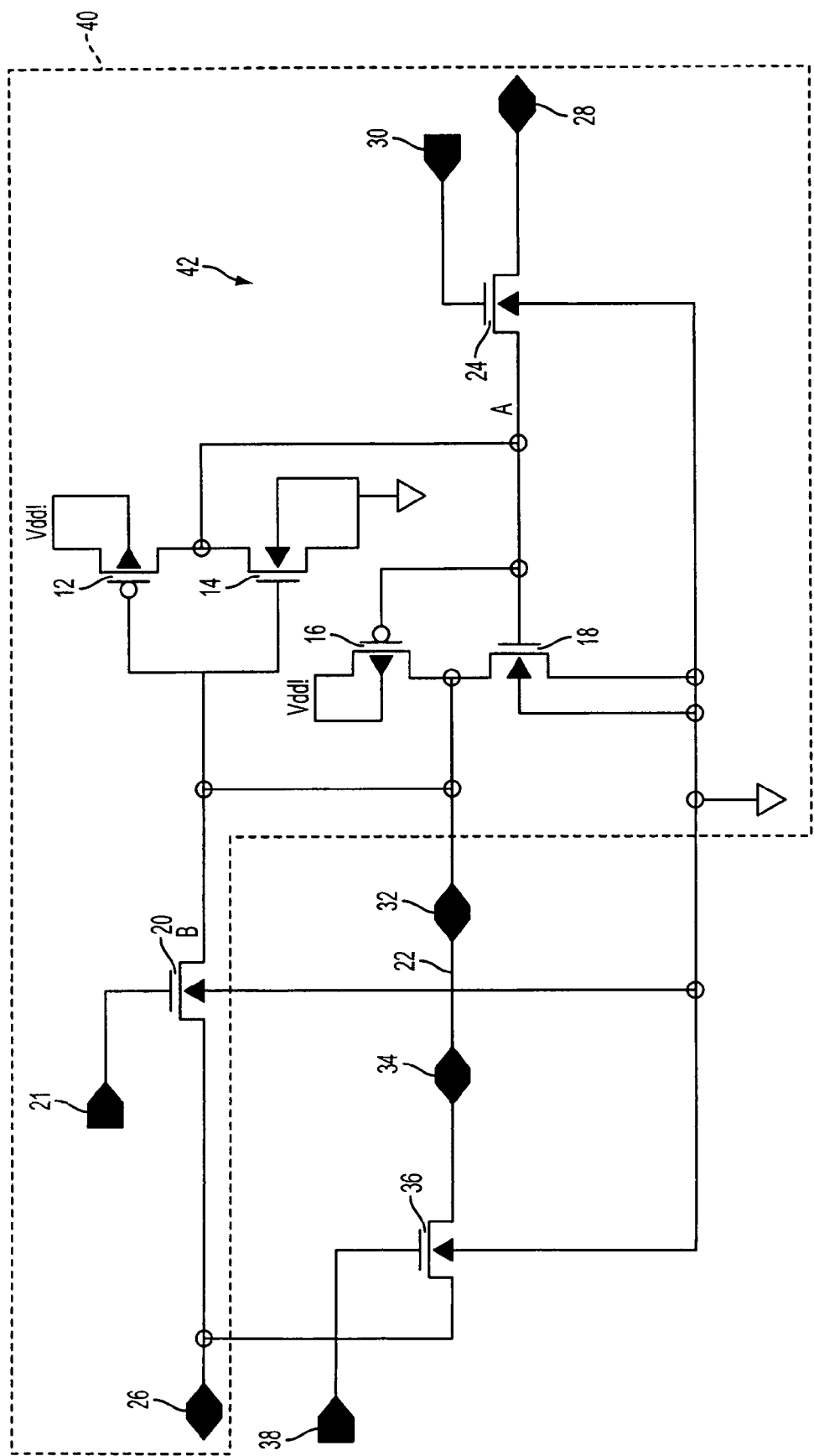

FIGS. 3a and 3b illustrate exemplary embodiments of an initial state RAM (ISRAM) memory cell 40 having its initial state programmed to a first state, i.e., FIG. 3a programmed to logic 1; or programmed to a second state, i.e., FIG. 3b programmed to logic 0. In FIGS. 3a and 3b, each initial state RAM cell 40 includes volatile and non-volatile portions. The volatile portion 42 (outlined by a dotted line in FIGS. 3a and 3b) comprises the circuitry of the conventional SRAM cell 10 (FIG. 2). The non-volatile portion comprises two initial state connection nodes 32, 34, an initial state control transistor 36, and an initial state control signal line 38. The gate of the initial state control transistor 36 has an electrical connection to the initial state control signal line 38, which allows the initial state control signal line 38 to control the initial state control transistor 36. The initial state control transistor 36 also has one source/drain electrical connection to connection node 34 and another source/drain connection to the bit line output signal 26. Connection node 32 has an electrical connection to the circuitry of the volatile portion 42 of the cell 40.

As shown in FIG. 3b, cell 40 also includes, as part of its non-volatile portion, an electrical connection 22 between initial state connection nodes 32, 34. Accordingly, FIG. 3a illustrates cell 40 having a non-volatile portion defining a first state, i.e., no connection 22, while FIG. 3b illustrates cell 40 having a non-volatile portion defining a second state, i.e., connection 22. In FIG. 3b, connection 22 connects the initial state control transistor 36 between the data node B and the associated bit line output 26; thereby providing an electrical connection between the volatile portion 42 and the non-volatile portion of cell 40.

Figure 4:
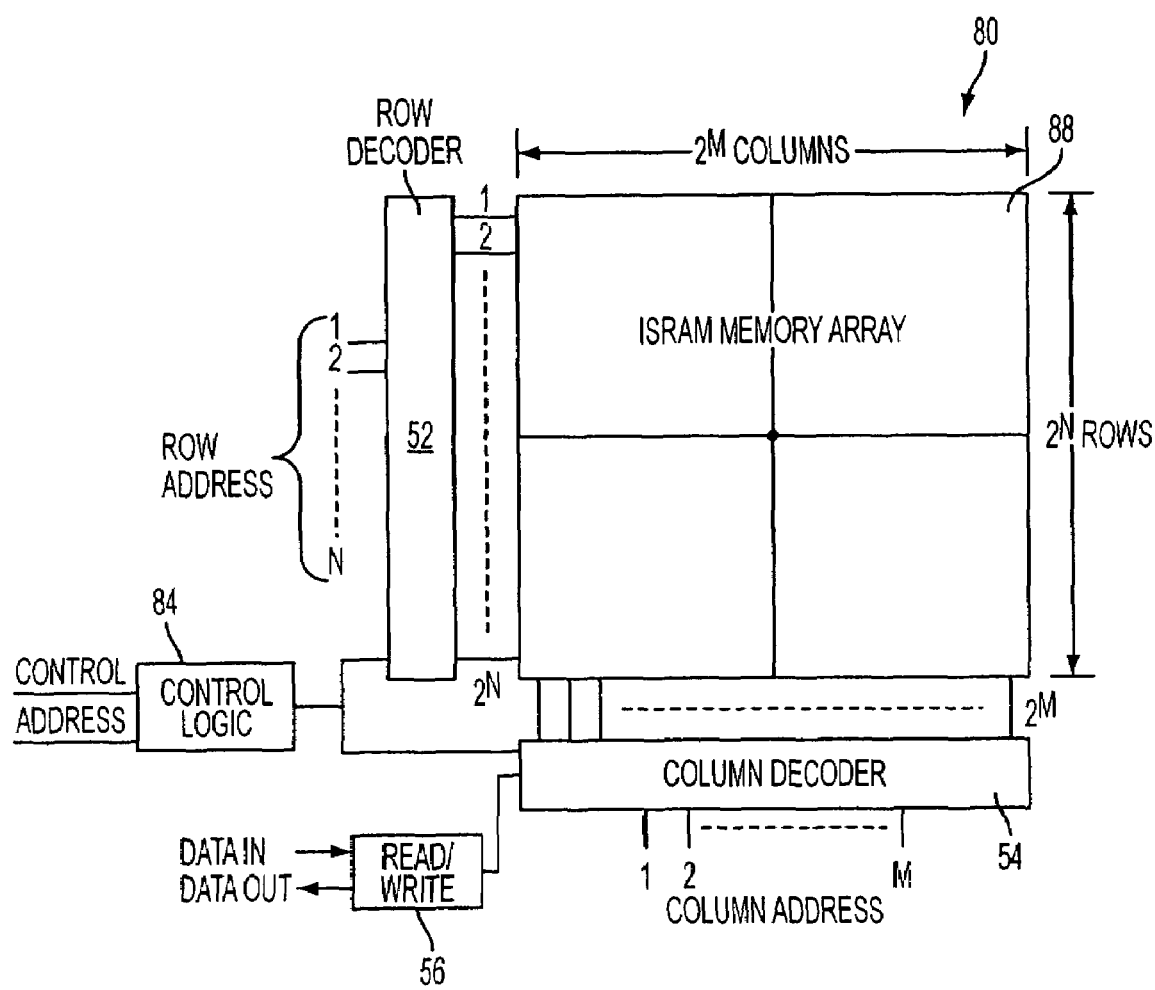
FIG. 4 shows a block diagram illustrating a memory array constructed in accordance with the invention.

FIG. 4 illustrates an initial state RAM device 80 comprising of a plurality of initial state RAM cells 40 embedded in an array 88. In addition to the circuitry for each of the initial state RAM cells 40, the initial state RAM device 80 also comprises a mechanism for storing and running the initialization sequence, which is activated to set the initial state of the volatile portions 42 in cells 40. The initialization sequence may be activated automatically, e.g., at system power-up, and/or manually, e.g., by an input signal to the device 80. The sequence may be stored in a controller 84, which may be a programmed processor, logic circuit, or hardwired circuit within the device 80.

Figure 5:
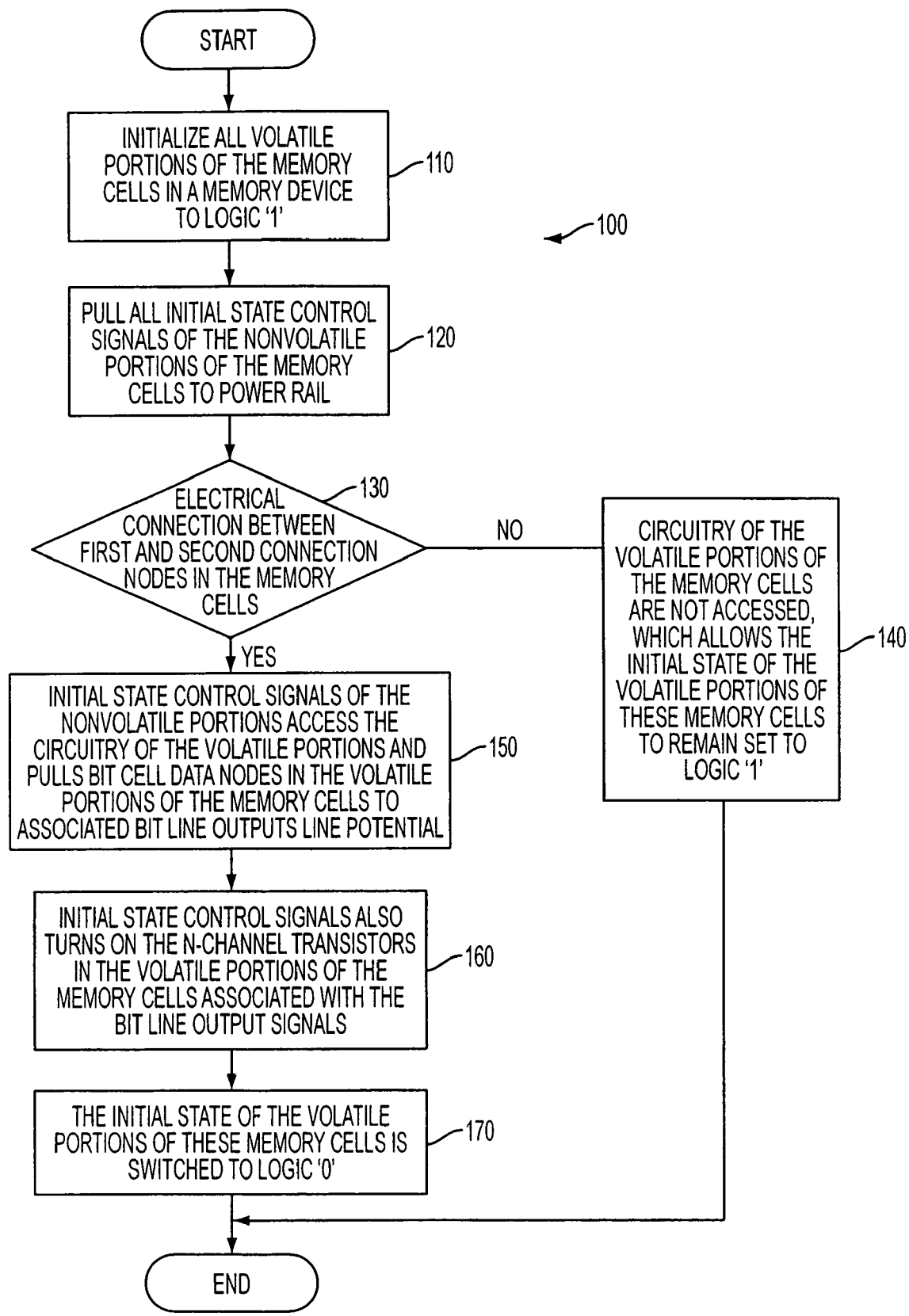
FIG. 5 illustrates an exemplary process of setting the initial state of a memory device constructed in accordance with the invention.

FIG. 5 illustrates an exemplary method 100 of setting the initial states of the volatile portions of all initial state RAM cells 40 of the initial state RAM device 80. There are two primary steps of the initialization sequence. The first primary step includes initializing all volatile portions of all initial state RAM cells to a first state, e.g., logic '1'. The second primary step includes switching all volatile portions of the initial state RAM cells whose non-volatile portions contain an electrical connection 22 between the two connection nodes 32, 34 from the first state to a second state (e.g., from logic '1' to '0').

Referring to FIG. 5, the method 100 sets all volatile portions in all initial state RAM cells 40 to logic '1' by pulling the bit line output 26 and pulling the word line output 21 for all cells 40 to the power rail (step 110). In a preferred embodiment, the acts of pulling the bit line output 26 signal and pulling the word line output 21 signal to the power rail occurs simultaneously for all cells 40. After the completion of step 110, the initial state of all volatile portions of all cells 40 are set to logic '1'.

The second primary step begins by first pulling the initial state control signal line 38 for all cells 40 to the power rail (step 120). If there is no connection 22 (step 130) in a particular cell (i.e., cell 40 in FIG. 3a), then the circuitry in the volatile portions of the cells, i.e., cells 40 in FIG. 3a, is not accessed and the initial state of the volatile portions of these cells 40 remains set to logic '1' (step 140). However, if connection 22 exists (step 130), then the circuitry of the volatile portions of the cells, i.e., cells 40 in FIG. 3b, is accessed and the initial state of the volatile portions of these cells 40 will be switched to logic '0', as is now described with reference to steps 150 to 170.

For each initial state RAM cell 40, as shown in FIG. 3b, when the initial state control signal line 38 is pulled to the power rail, connection 22 allows the initial state control transistor 36 of the non-volatile portion to pull the data node B (of the volatile portion) to the bit line output 26 line potential (step 150). As a result, the initial state control signal line 38 turns on the N-channel transistors 14 associated with bit line output 26 signals (step 160), thereby switching the volatile portion of each of these cells 40 to logic '0' (step 170).

As discussed above, the presence or absence of connection 22 defines the pre-coded information and thus, determines the initial state of the initial state RAM cell 40. Connection 22 can be added or removed by an alteration of a single, relatively low-cost mask during the manufacturing process of an initial state RAM device 80. The mask may be a programmable mask. Therefore, during the manufacturing process, any design changes to the pre-coded information can be restricted to the associated mask for the connection 22, which reduces manufacturing costs.

Figure 6:
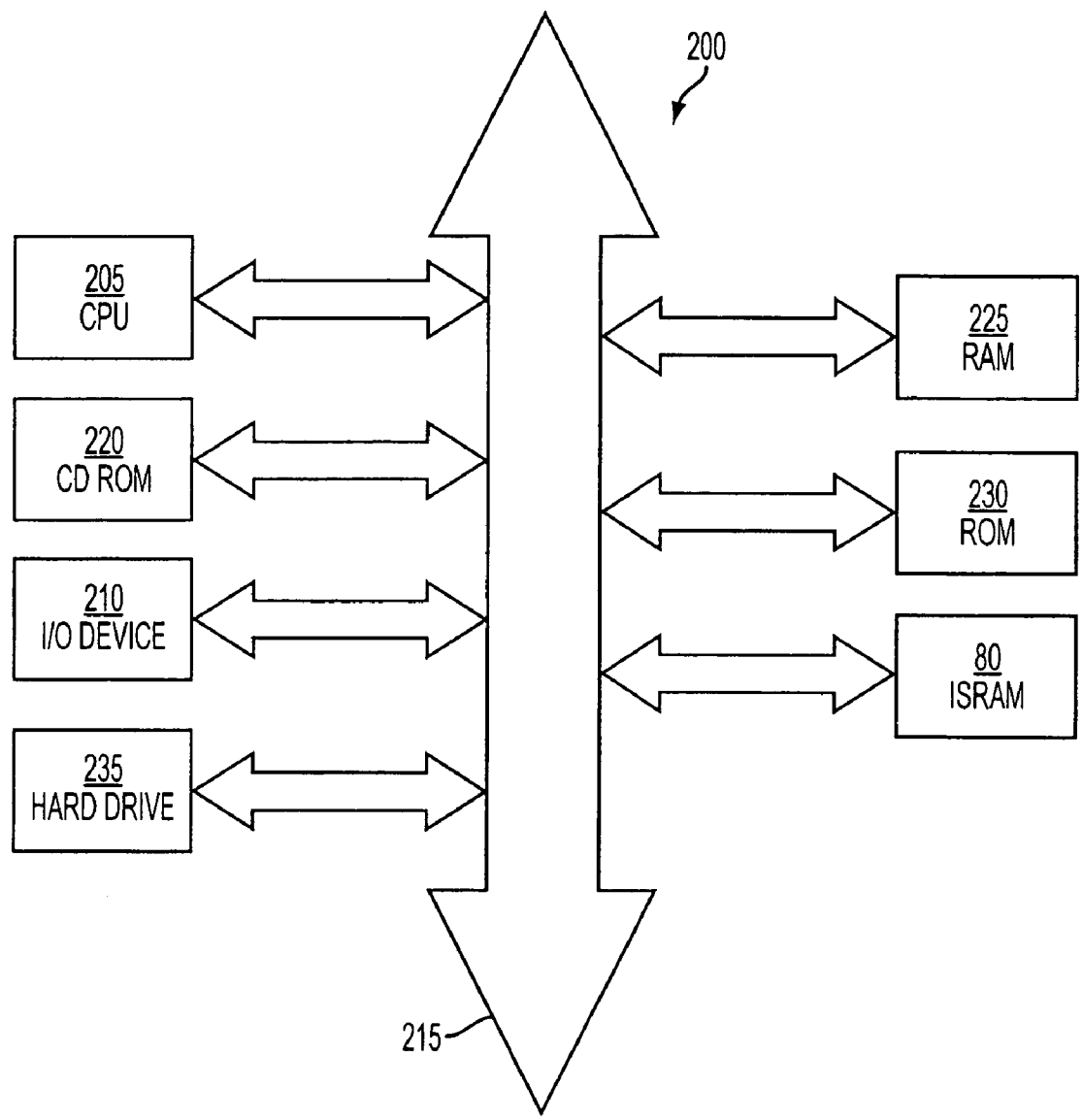
FIG. 6 shows a block diagram illustrating a processor system utilizing a memory device constructed in accordance with the invention.

FIG. 6 illustrates a simplified processor system 200, which can be any system including one or more processors, for example a computer system. The processor system 200 generally comprises a central processing unit (CPU) 205, such as a microprocessor, a digital signal processor, or other programmable digital logic devices, which communicates with an input/output (I/O) device 210 over a bus 215. In the case of a computer system, the processor system 200 may include peripheral devices such as a compact disc (CD) ROM drive 220 and a hard drive 235. RAM 225 and ROM 230 devices communicate with the CPU 205 over bus 215 typically through a memory controller.

The initial state RAM device 80 communicates with the CPU 205 over bus 215 typically through a memory controller. The initial state RAM device 80 is preferably constructed as an integrated circuit, which includes an initial state RAM array 88 having at least one initial state random access memory cell 40 according to the invention. If desired, the initial state RAM device 80 may be combined with the processor, for example CPU 205, in a single integrated circuit.

FIG. 6 shows a processor system 200 comprising RAM 225, ROM 230, and ISRAM 80 devices. Nevertheless, it should be understood that initial state RAM device 80 can replace one or both of RAM 225 and ROM 230 typically used in the processor system 200. For example, in a processor system that conventionally uses a ROM 230, but which would benefit from the ability to modify the ROM 230 contents, e.g., during system debugging, the initial state RAM device 80 can replace the ROM 230. Since RAM 225 is typically larger than ROM 230, an initial state RAM device 80 would be larger than a ROM 230 of the same storage capacity. Therefore, there is an associated size and cost increase. However, if the RAM 225 capability is only required under constrained conditions, e.g., it may only be required in debugging environments, and not required to operate across the full spread of process, voltage and temperature, it might be possible to compromise the RAM 225 function in order to reduce the size. For this type of processor system, two levels of ROM 230 customizations are required: one that leaves the RAM 225 available and one that only allows ROM 230 function.

In another exemplary embodiment, initial state RAM device 80 can replace RAM 225, which is beneficial since initial state RAM device 80 will only be slightly larger than a RAM 225 of the same storage capacity. For this type of processor system 200, both the RAM 225 and ROM 230 functions must be reliable under all operating conditions.

In a preferred embodiment, initial state RAM device 80 replaces both RAM 225 and ROM 230 devices. In a typical memory capacity, the initial state RAM device 80 would be smaller than the combined size of the individual ROM 230 and RAM 225 devices. In this type of processor system 200, ROM 230 and RAM 225 functions are not used simultaneously; for example, when ROM 230 is only required for performing a start-up function.

Figure 7:
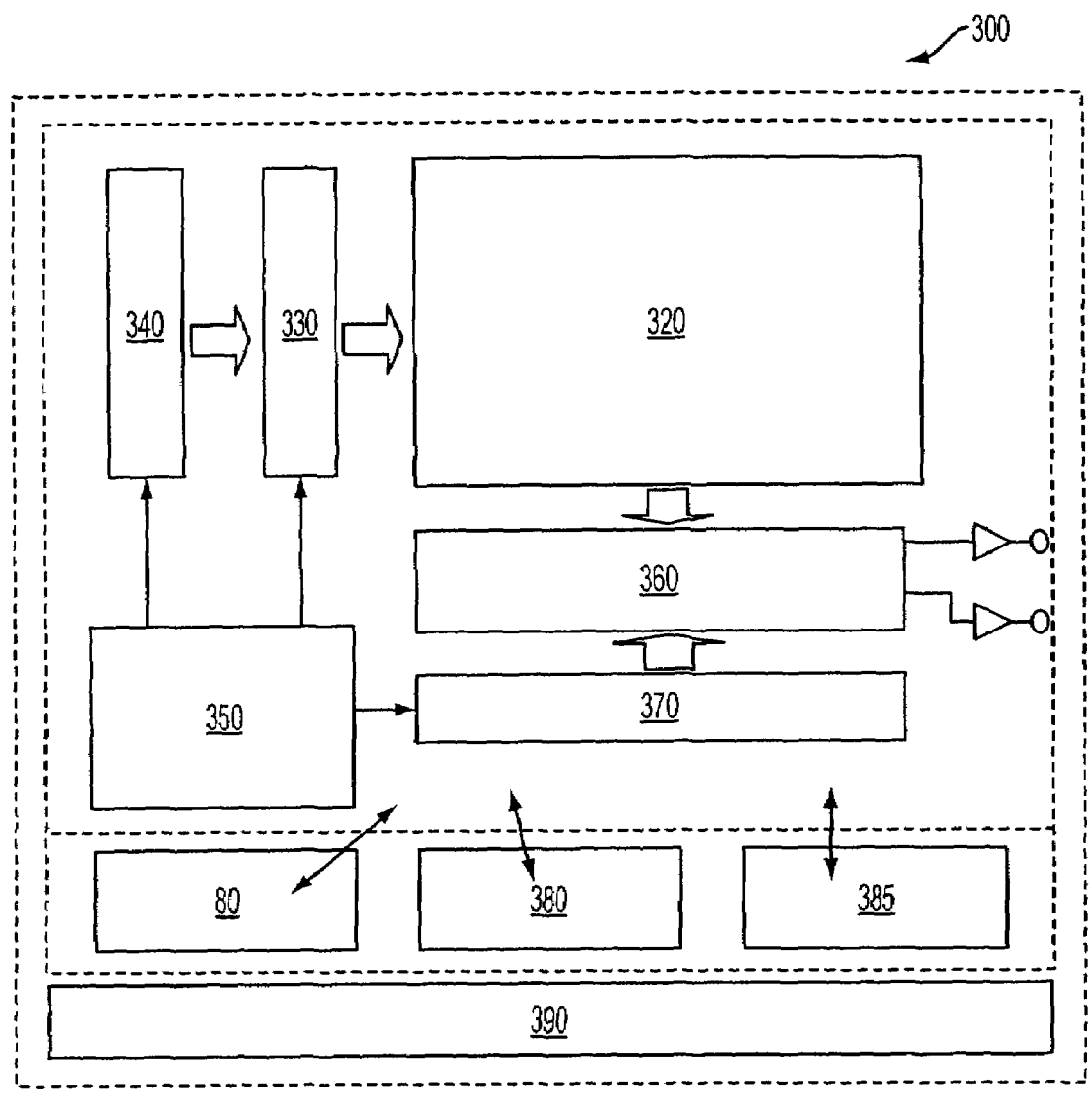
FIG. 7 shows an imaging device having a memory device constructed in accordance with the invention.

In another exemplary embodiment, the initial state RAM device is part of an imaging device. Without being limiting, the imaging device could be incorporated into a camera system, scanner, machine vision system, vehicle navigation system, cell phone, and others. FIG. 7 illustrates an imaging device 300 having of an initial state RAM device 80 constructed in accordance with the present invention. The initial state RAM device 80 can be in communication with a pixel cell array 320 and control circuit 350.

Pixel cell array 320 comprises a plurality of pixel cells arranged in a predetermined number of columns and rows. A plurality of row and column lines is provided for the entire array 320. The row lines are selectively activated by the row driver 330 in response to row address decoder 340 and the column select lines are selectively activated by the column driver 360 in response to column address decoder 370.

The imaging device 300 is operated by the control circuit 350 that controls address decoders 340, 370 for selecting the appropriate row and column lines for pixel readout, and row and column driver circuitry 330, 360 that apply driving voltage to the drive transistors of the selected row and column lines. A serializer module 380 and SFR (Special Function Register) device 385 can each be in communication with the control circuit 320. Optionally, a localized power source 390 can be incorporated into the imaging device 300.

It should be understood that a memory device constructed in accordance with exemplary embodiments of the invention is not limited to an imaging device or a CPU-based system; the memory device can be part of any larger integrated circuit.

The processes and devices described above illustrate preferred methods and typical devices of many that could be used and produced. The above description and drawings illustrate embodiments, which achieve the objects, features, and advantages of the present invention. However, it is not intended that the present invention be strictly limited to the above-described and illustrated embodiments. Any modification, though presently unforeseeable, of the present invention that comes within the spirit and scope of the following claims should be considered part of the present invention.

What is claimed as new and desired to be protected by Letters Patent of the United States is:

1. A memory cell comprising:
   a volatile circuit portion, said volatile circuit portion comprising at least a first transistor, said first transistor having an electrical connection to a first connection node; and
   a non-volatile circuit portion for selectively programming said volatile circuit portion, said non-volatile circuit portion comprising a programmable circuit portion and a second transistor, said second transistor having a gate connected to receive a control signal for controlling said selected programming and having an electrical connection to a second connection node,
   wherein said programmable circuit portion has a state defined by a presence or absence of a non-switchable electrical connection between said first and second connection nodes.

2. The memory cell of claim 1, wherein said state of said programmable circuit portion is retained even if said memory cell loses power.

3. The memory cell of claim 1, wherein said control signal sets an initial state of said volatile circuit portion to a state corresponding to a state of said programmable circuit portion.

4. A semiconductor circuit comprising:
a memory array comprising a plurality of memory cells each cell comprising:
a volatile portion;
a non-volatile portion having a predefined logic state, said non-volatile portion comprising a control transistor, said control transistor responsive to an initial state control signal for programming said predefined logic state into said volatile portion;
a first connection node coupled to said volatile portion and a second connection node coupled to said non-volatile portion,
wherein a state of a non-switchable electrical connection between said first and second connection nodes sets said predefined logic state.

5. The semiconductor circuit of claim 4, wherein said electrical connection between said first and second connection nodes connects said control transistor between a bit line output signal and a memory cell node of said volatile portion.

6. A semiconductor circuit comprising:
a memory array comprising a plurality of memory cells each cell comprising:
a volatile portion;
a non-volatile portion having a predefined logic state, said non-volatile portion comprising a control transistor, said control transistor responsive to an initial state control signal for programming said predefined logic state into said volatile portion;
a controller for generating said initial state control signal, wherein said initial state control signal couples said non-volatile portion to said volatile portion to set a logic state for said volatile portion, wherein said controller operates an initialization sequence comprising the steps of:
setting an initial state of said volatile portions of said plurality of memory cells to a first state;
driving a plurality of initial state control signals connected to said non-volatile portions of said plurality of memory cells;
pulling a plurality of cell data nodes from a subset of said volatile portions of said plurality of memory cells to associated plurality of bit line output line potentials based on a value of predefined logic state; and
switching said initial state of said volatile portions of said subset from said first state to a second state.

7. The semiconductor circuit of claim 6, wherein said predefined logic state is retained when said memory cell loses power.

8. An imaging device comprising:
an imaging array; and
a memory system operating in conjunction with said array and having at least one memory array having a plurality of memory cells, each cell comprising:
a volatile memory portion;
a non-volatile memory portion having a predefined logic state, said non-volatile memory portion comprising an initial state control transistor, said initial state control transistor responsive to an initial state control signal for programming said predefined logic state into said volatile memory portion;
a first connection node coupled to said volatile portion and a second connection node coupled to said non-volatile portion,
wherein a state of a non-switchable electrical connection between said first and second connection nodes sets said predefined logic state.

9. The imaging device of claim 8 further comprising a controller for generating said initial state control signal, wherein said volatile memory portion is initialized to a first logical state and said initial state control signal couples said non-volatile memory portion to said volatile memory portion state to set a logic state for said volatile memory portion to a second logical state.

10. An integrated circuit comprising:
a memory array comprising memory cells each memory cell comprising:
a volatile memory circuit portion, said volatile memory circuit portion comprising at least a first transistor, said first transistor having an electrical connection to a first mask programmable circuit node; and
a non-volatile memory circuit portion for selectively programming said volatile memory circuit portion, said non-volatile memory circuit portion comprising a programmable circuit portion and a second transistor, said second transistor having a gate connected to receive a control signal for controlling said selected programming and having an electrical connection to a second mask programmable circuit node,
wherein said programmable circuit portion has a state defined by a presence or absence of a non-switchable electrical connection between said first and second mask programmable circuit nodes.

11. The integrated circuit of claim 10, wherein a controller operates an initialization sequence comprising the steps of:
setting an initial state of said volatile memory circuit portions of said memory cells to a first state;
driving initial state control signals connected to said non-volatile memory circuit portions of said memory cells;
pulling cell data nodes from a subset of said volatile memory circuit portions of said memory cells to associated of bit line output line potentials based on a value of predefined logic state; and
switching said initial state of said volatile memory circuit portions of said subset from said first state to a second state.

12. A method for operating a memory device comprising a plurality of memory cells having volatile and non-volatile portions, said non-volatile portions having a predefined logic state, said method comprising the steps of:
setting an initial state of said volatile portions of said plurality of memory cells to a first state;
driving a plurality of initial state control signals connected to said non-volatile portions of said plurality of memory cells;
pulling a plurality of cell data nodes from a subset of said volatile portions of said plurality of memory cells to associated plurality of bit line output line potentials based on a predefined logic state; and
switching said initial state of said volatile portions of said subset from said first state to a second state.

13. The method of claim 12, wherein said step of pulling a plurality of bit line outputs and pulling a plurality of word line outputs associated with said volatile portions to a power rail occurs simultaneously.

14. The method of claim 12, wherein said subset of said plurality of memory cells comprising of an electrical connection between said volatile and non-volatile portions.

15. The method of claim 12, wherein said setting step includes pulling a plurality of bit line outputs and pulling a plurality of word line outputs associated with each said volatile portions to a power rail.

16. The method of claim 12, wherein said switching step includes turning on a plurality of n-channel transistors associated with a plurality of bit line output signals, said plurality of bit line output signals associated with said volatile portions of said subset.

* * * * *